(12) United States Patent
McGuffin

(10) Patent No.: US 7,720,442 B2
(45) Date of Patent: May 18, 2010

(54) TESTING SYSTEMS AND METHODS FOR AIRCRAFT RADIOS

(75) Inventor: Thomas F. McGuffin, Seattle, WA (US)

(73) Assignee: Honeywell International, Inc., Morristown, NJ (US)

( * ) Notice: Subject to any disclaimer, the term of this patent is extended or adjusted under 35 U.S.C. 154(b) by 722 days.

(21) Appl. No.: 11/164,234

(22) Filed: Nov. 15, 2005

(65) Prior Publication Data

US 2007/0207739 A1    Sep. 6, 2007

(51) Int. Cl.
*H04B 17/00*    (2006.01)

(52) U.S. Cl. .............. 455/67.11; 455/115.1; 455/115.2; 455/115.4

(58) Field of Classification Search .............. 455/67.11, 455/67.13–67.16, 132, 431, 556.1, 562.1, 455/569.1, 115.1, 115.2, 115.4
See application file for complete search history.

(56) References Cited

U.S. PATENT DOCUMENTS

| | | | |
|---|---|---|---|
| 4,964,065 A * | 10/1990 | Hicks et al. ................. 709/226 |
| 5,548,820 A * | 8/1996 | Victorin .................... 455/67.14 |
| 5,943,609 A | 8/1999 | Ericson et al. |
| 6,310,579 B1 * | 10/2001 | Meredith ..................... 343/703 |
| 7,076,213 B2 * | 7/2006 | Lee .......................... 455/67.14 |
| 7,289,071 B2 * | 10/2007 | Hung et al. ................. 343/702 |
| 2004/0127261 A1 | 7/2004 | Endress |
| 2005/0107080 A1 * | 5/2005 | Hasegawa et al. ........... 455/423 |
| 2006/0003773 A1 * | 1/2006 | Miyata et al. ............. 455/452.2 |
| 2007/0010208 A1 * | 1/2007 | Goldberg ................. 455/67.14 |

* cited by examiner

*Primary Examiner*—Tuan H Nguyen
(74) *Attorney, Agent, or Firm*—Fogg & Powers LLC

(57) ABSTRACT

A system and method for enhanced use of voltage standing wave ratio (VSWR) tests of an avionic radio and antenna is disclosed. A signal processor/generator conducts a VSWR test of an antenna and archives the result within a database. Multiple tests are conducted spanning periods of operation of the radio. Tests may also be conducted at multiple frequencies, such as commonly used channels of communication. Results are uploaded to an external diagnostic device and analyzed to evaluate deterioration of the antenna. Analysis may including comparing test results to threshold values and analyzing test results for frequency and time dependent trends.

17 Claims, 3 Drawing Sheets

TESTING SYSTEMS AND METHODS FOR AIRCRAFT RADIOS

BACKGROUND OF THE INVENTION

Modern aircraft rely heavily on radio contact with ground based communication systems. In addition to conventional air traffic control communications, aircraft may use radio communication to upload weather information and provide telephone and data communication for passengers. In many aircraft one or more antennae are positioned below the aircraft to facilitate communication with ground based transmitters. In many instances such antennae are exposed to airborne water and contaminants as well as water and dust raised by the landing gear. Accordingly, antennae, cables, and couplers connecting the externally positioned antenna to internal cables are subject to deterioration due to corrosion and contamination.

Inefficient or defective performance of antennae, cables, and connectors is difficult to detect. In prior systems, a voltage standing wave ratio (VSWR) test function provided by the avionic radio enables evaluation of impedance differences between the internal circuits of the communications system and the antenna and cables. A result substantially above unity from the VSWR test function may result from a defect within the avionic radio or defective performance of the antenna, cables, or connectors. A non-unity results may prompt an operator to remove the radio for repair by a technician only to find that the radio is perfectly operable, while the antenna, cables, or connectors are defective. This process results in unnecessary interruption of aircraft service and wasted labor on the part of the repair technician.

In view of the foregoing it would be an advancement in the art to provide convenient systems methods for evaluating operability of a radio antenna and associated cabling without removing the communication system from the aircraft.

BRIEF SUMMARY OF THE INVENTION

A method for evaluating transmission equipment includes a communication system configured to repeatedly conduct a voltage standing wave ratio (VSWR) test on a an antenna electrically coupled to an electrical signal processor/generator, such as a radio, to generate a plurality of VSWR test results. The VSWR test results are stored in nonvolatile memory within the signal processor/generator. The VSWR test results are uploaded to an external memory bearing device selectively connected to the signal processor/generator. The external device analyzes the data to evaluate the condition of the antenna. Analysis may include analyzing trends in the data, such as time dependent trends.

In some embodiments VSWR tests are conducted in series across a range of frequencies. The stored results of such tests may be analyzed for frequency dependent trends. The frequencies tested may correspond to commonly used communication channels. In one context the frequencies are 118, 120.1, 122.2, 124.3, 126.4, 128.5, 130.6, 132.7, 134.8, and 136.9 MHz.

BRIEF DESCRIPTION OF THE SEVERAL VIEWS OF THE DRAWING

The preferred and alternative embodiments of the present invention are described in detail below with reference to the following drawings.

DETAILED DESCRIPTION OF THE INVENTION

Figure 1A:
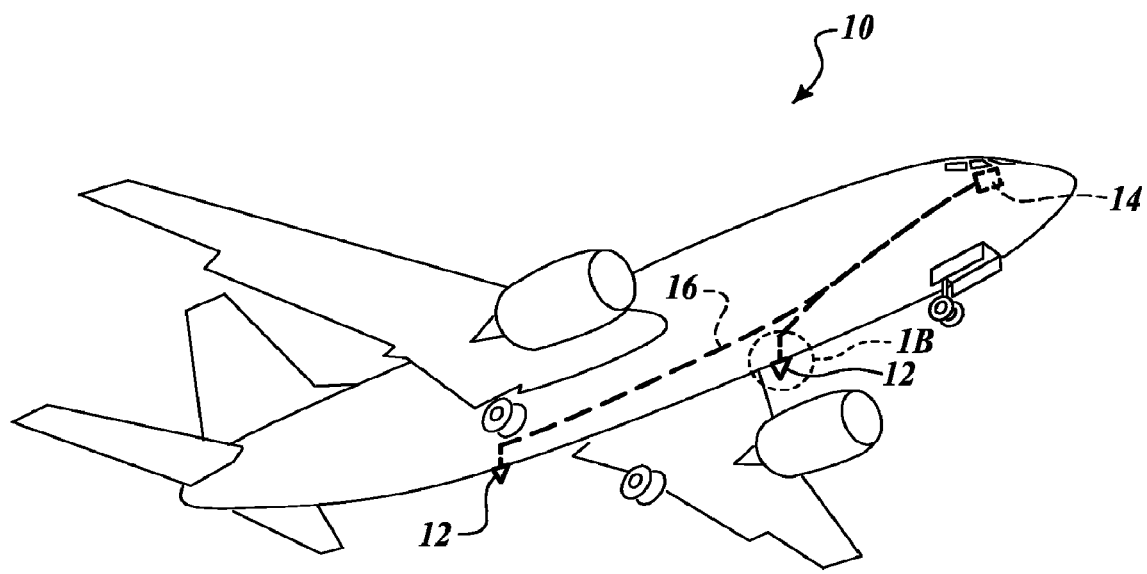
FIG. 1A is a perspective view of an aircraft communication system formed in accordance with an embodiment of the present invention.
Figure 1B:
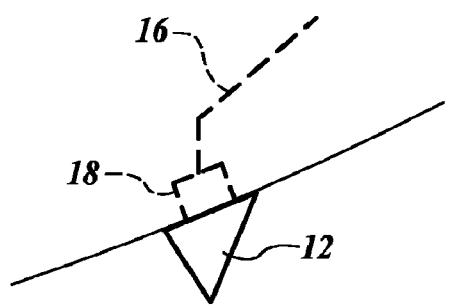
FIG. 1B is a schematic representation of an antenna, cable, and coupler used in the aircraft of FIG. 1A.

Referring to FIGS. 1A and 1B, an aircraft 10 typically has one or more antenna 12. To facilitate communication with ground based transmitters. The antennae 12 may be positioned on the lower side of the aircraft 10. A cable 16 or series of cables or other conductor, connects the antenna 12 to an avionic radio 14. A coupler 18 connects the internal cable 16 to the external antenna 12.

Figure 2:
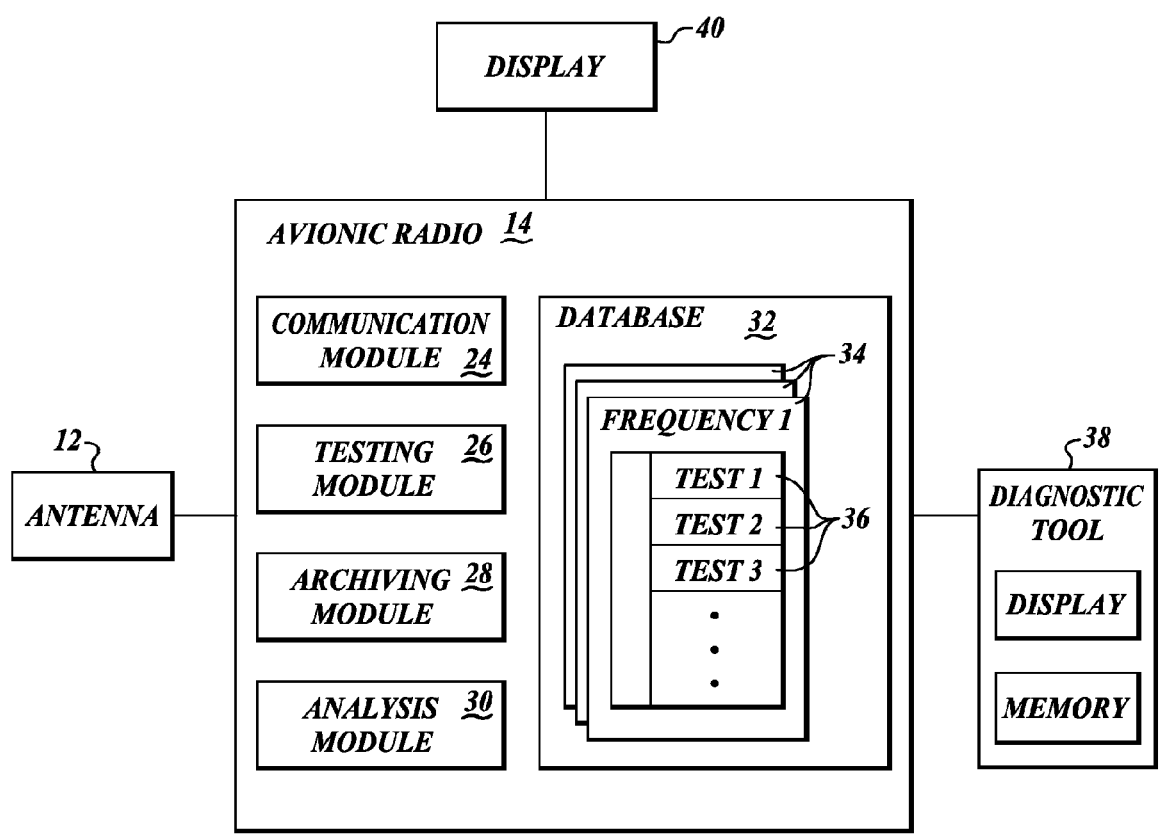
FIG. 2 is a schematic block diagram of an avionic radio having enhanced VSWR testing functionality formed in accordance with an embodiment of the present invention.

Referring to FIG. 2, in one embodiment the avionic radio 14 includes a communication module 24, a testing module 26, an archiving module 28, and an analysis module 30. A communication module 24 facilitates communication between the avionic radio 14 and an external diagnostic tool 38 in order to offload display test results on the tool to an operator. In one embodiment, the communication module 24 communicates with a PCMCIA card, or similar device, connected to a desktop, notebook, or other computer serving as the diagnostic tool 38. The desktop, notebook, or other computer, may execute diagnostic software. In other embodiments, a handheld diagnostic tool 38 couples to the avionic radio 14. In still other embodiments, the test results are written to removable memory coupled to the radio 14 and then transferred from the external memory to the diagnostic tool 38.

A testing module 26 conducts a test of the VSWR of the antenna 12, cable 16, and any couplers 18. Differences in the impedance of the antenna 12 and the impedance of the cable 16 and couplers 18 will result in a VSWR result above unity. A non-unity VSWR result may also result from poor connections at the couplers 18 or corroded or worn portions of the cable 16. The testing module 26 tests VSWR at regular time intervals, upon powering on of the avionic radio 14, upon receiving an input from an operator, or some other manual triggering event.

In some embodiments, the testing module 26 tests the VSWR at various frequencies. Impedance is frequency dependent. Accordingly, impedance mismatches may be present at some frequencies and not others. Accordingly, the deterioration of the antenna 12, cables 16, and coupler 18 is monitored more closely by testing multiple frequencies in order to provide advanced notice of catastrophic failure.

In one embodiment, the testing module 26 sweeps the entire frequency range of the avionic radio 14 while sampling the VSWR at fixed time or frequency intervals. Alternatively, the testing module 26 evaluates VSWR at discrete frequencies at regular intervals. Intervals are regular on a linear or logarithmic scale or are varied to accommodate frequency response characteristics of a radio 14. Tested frequencies may correspond to frequency channels frequency used for avionic communications. In the illustrated embodiment, frequencies of 118, 120.1, 122.2, 124.3, 126.4, 128.5, 130.6, 132.7, 134.8, and 136.9 MHz are tested.

In one embodiment, results of the VSWR test are converted to an N bit word, such as an eight bit word. Alternatively, the VSWR results are compared to a threshold value and a single bit word indicating whether the VSWR is greater than or less than the threshold is stored as the test result.

The archiving module 28 stores the results of the VSWR tests within a database 32. In one embodiment, the results may be stored within records 34 corresponding to the frequency tested. Individual entries 36 within a record 34 correspond to VSWR tests conducted at different times. The entries 36 store both a VSWR value and a time of testing in order to allow first, second, and higher order derivative based trend analysis on the test results. Alternatively, where the testing module 26 is configured to test at regular periods, the time interval between tests is assumed and need not be recorded in order to analyze time dependent trends.

The entries 36 accumulate within a record 34 until the record 34 is full. Alternatively, the record 34 functions as a rotating stack with newest test result overwriting oldest test results and a pointer being maintained to indicate the locating of the newest or oldest entry 36.

Various means for storing the test results are possible. For example, the records 34 may correspond to a series of tests conducted at about the same time whereas the entries 36 correspond to test results at different frequencies. In still other embodiments, test results are stored as an undifferentiated block of data interpretable by assuming that every N test results correspond to N frequencies tested for each series of tests conducted.

In some embodiments, an analysis module 30 analyzes the archived data within the database 32. Analysis may include time and frequency dependent analysis of the test results. In some embodiments, the analysis module 30 is omitted and the functionality of the analysis module 30 is provided by the external diagnostic tool 38. In one embodiment, the analysis module 30 outputs a result on a display 40 coupled to the radio 14. An output may be a number or series of numbers summarizing the analysis or a pass/fail indicator. The display 40 may be one or more dial indicators, LEDs, LCDs, or the like.

Analysis may include evaluating whether any one test result, or a local average of test results, falls above a predetermined threshold value. Alternatively, a sum or average of tests across multiple frequencies is compared to a threshold value. Values exceeding the threshold value trigger an indication of failure to the operator. In one embodiment, the threshold value is well below the value for VSWR indicating catastrophic failure of the antenna 14, cable 16, and/or coupler 18. The threshold value may also represent the point at which power transmission through the antenna 14 is inadequate in view of the distance between the aircraft 10 and a receiving facility. Multiple threshold values may be used to indicate various degrees of deterioration of the antenna 12 and connecting structures. For example, exceeding one threshold value indicates that replacement should occur soon whereas exceeding another indicates that the antenna is unsafe to use. Indications displayed to the operator may indicate the highest of the multiple threshold values that has been exceeded.

In one embodiment, advanced notice of failure is provided by evaluating first, second, or higher order derivatives to determine increases in the rate of deterioration. Derivatives are calculated for each frequency tested or based on averages calculated across frequencies. Values of first, second, or higher order derivatives are compared to threshold values or to prior calculated values for the derivatives to detect changes in the rate of deterioration that may indicate physical damage to the antenna 14, cables 16, and coupler 18.

In some embodiments, test results are mathematically distilled into one or more values characterizing the results. For example, a mean and standard deviation are calculated across all frequencies, or groups of contiguous frequencies, for a series of tests performed at about the same time. A maximum, minimum, average, twenty-fifth percentile and seventy-fifth percentile may likewise be evaluated. Such values may be reported to an operator or compared to thresholds indicating proper operation in order to anticipate failure of the antenna 14, cables 16, and coupler 18.

Figure 3:
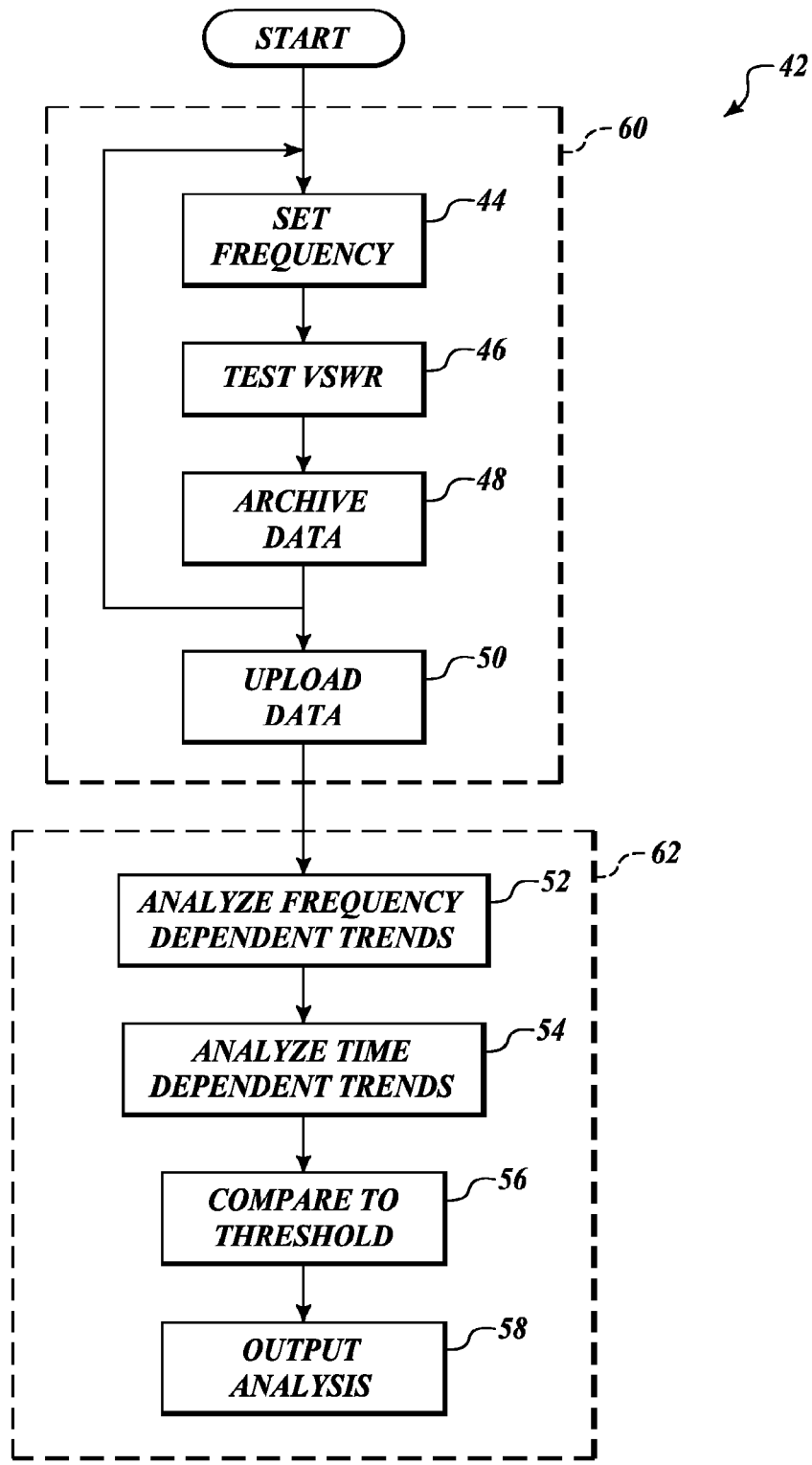
FIG. 3 is a process flow diagram of a method for enhanced VSWR testing formed in accordance with an embodiment of the present invention.

Referring to FIG. 3, an example method 42 performed by the radio 14 for enhanced VSWR testing begins at block 44 by setting a carrier frequency. VSWR is evaluated at block 46 at the frequency set at block 44. The results of the VSWR test are archived at block 48. The functions of blocks 44, 46, and 48 may be repeated, setting a different frequency for each iteration, or repeated at different times, such as periodically or upon powering on of the radio 14. The functions of blocks 44, 46, and 48 may also be repeated both at different frequencies and at different times.

The method 42 further includes uploading the test results to a diagnostic tool 38 at block 50. At block 52, the test results are analyzed to identify frequency dependent trends according to the mathematic methods described above. At block 54, the test results are analyzed to identify time dependent trends. Test results are compared to threshold values to evaluate antenna performance at block 56.

At block 58, the results of the analysis are outputted to an operator. Output may be by means of a screen, lights, printouts, audible alarms, and the like. In some embodiments, blocks 52, 54, and 56 are omitted, in which case the step at block 58 includes providing the data, or a graphical or tabular summary of the data to be analyzed by another device or by an operator.

In the illustrated embodiment, steps within box 60 are typically conducted on the radio 14. Steps within box 62 are conducted on the external diagnostic tool 38. In some embodiments, one or more of the analyzing steps (blocks 52, 54, and 56) and output step (block 58) are also performed within the radio 14. In such embodiments, the uploading step 50 would be omitted. In still other embodiments, the step of archiving data (block 48) is performed by the external diagnostic tool 38 coupled to the radio 14 that receives the results of the testing step (block 46).

The various steps and ordering of steps of method 42 are exemplary only. Steps may be omitted or reordered without departing from the scope of the invention.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

What is claimed is:

1. A method for evaluating transmission equipment, the method comprising:

repeatedly conducting a voltage standing wave ratio (VSWR) test over a plurality of frequencies on a communication system comprising at least one antenna electrically coupled to an electrical signal processor/generator to generate a plurality of VSWR test results at different times for each of the plurality of frequencies;

storing the plurality of VSWR test results in nonvolatile memory within the signal processor/generator;

uploading the plurality of VSWR test results to an external memory bearing device;

combining the plurality of VSWR test results generated at different times for at least a subset of the plurality of frequencies to generate at least one combined VSWR test result used in evaluating the transmission equipment; and comparing one of the at least one combined VSWR test result and the plurality of VSWR test results for each of the plurality of frequencies to a plurality of threshold values, wherein each threshold value indicates a degree of deterioration of the antenna.

2. The method of claim 1, further comprising performing trend analysis on the at least one combined VSWR test result.

3. The method of claim 2, wherein performing trend analysis includes evaluating one or more derivatives for each of the plurality of frequencies.

4. The method of claim 2, wherein performing trend analysis includes evaluating one or more derivatives for the at least one combined VSWR test results.

5. The method of claim 1, wherein the plurality of frequencies correspond to established communication channels.

6. The method of claim 1, wherein the frequencies include 118, 120.1, 122.2, 124.3, 126.4, 128.5, 130.6, 132.7, and 136.9 MHz.

7. A system for evaluating transmission equipment, the system comprising:
   an antenna;
   a signal processor/generator electrically coupled to the antenna, the signal processor/generator comprising a memory and a testing module, the testing module configured to periodically conduct voltage standing wave ratio (VSWR) tests of the signal processor/generator and the antenna over a plurality of frequencies to generate a plurality of VSWR test results at different times for each of the plurality of frequencies and configured to store the results of the VSWR test in the memory; and
   a computing device selectively placed in data communication with the signal processor/generator and configured to combine VSWR test results generated at different times for at least a subset of the plurality of frequencies to generate at least one combined VSWR test result used in evaluating the transmission equipment;
   wherein the computing device is configured to compare one of the at least one combined VSWR test result and the VSWR test results for each of the plurality of frequencies to a plurality of threshold values, wherein each threshold value indicates a degree of deterioration of the antenna.

8. The system of claim 7, wherein the computing device is one of an analysis module located in the transmission equipment and an external computing device coupled to the transmission equipment.

9. The system of claim 7, wherein the computing device is configured to perform trend analysis by evaluating one or more derivatives for at least one of the combined VSWR test result and VSWR test results for each of the plurality of frequencies.

10. The system of claim 7, wherein the plurality of frequencies correspond to established communication channels.

11. The system of claim 10, wherein the frequencies include 118, 120.1, 122.2, 124.3, 126.4, 128.5, 130.6, 132.7, 134.8, and 136.9 MHz.

12. A method for evaluating transmission equipment, the method comprising:
   conducting multiple temporally separated series of voltage standing wave ratio (VSWR) tests, the VSWR tests in each of the multiple series at a unique frequency on a communication system comprising an antenna electrically coupled to an electrical signal processor/generator, to generate multiple VSWR test results at different times for each unique frequency in the multiple series;
   storing the multiple series of VSWR test results in nonvolatile memory within the signal processor/generator;
   uploading the multiple series of VSWR test results to an external memory bearing device selectively connects to the signal processor/generator;
   combining the multiple series of VSWR test results to generate at least one combined VSWR test result used in evaluating the transmission equipment; and
   comparing one of the at least one combined VSWR test result and the plurality of VSWR test results for each of the plurality of frequencies to a plurality of threshold values, wherein each threshold value indicates a degree of deterioration of the antenna.

13. The method of claim 12, further comprising performing frequency dependent trend analysis on the series of VSWR test results to evaluate antenna performance.

14. The method of claim 12, further comprising evaluating one or more derivatives for the at least one combined VSWR test results.

15. The method of claim 12, further comprising performing time dependent trend analysis on the multiple series of VSWR test results.

16. The method of claim 12, wherein the plurality of frequencies correspond to established communication channels.

17. The method of claim 16, wherein the frequencies include 118, 120.1, 122.2, 124.3, 126.4, 128.5, 130.6, 132.7, 134.8, and 136.9 MHz.

* * * * *